United States Patent [19]
Feng

[11] Patent Number: 5,497,347
[45] Date of Patent: Mar. 5, 1996

[54] BICMO CACHE TAG COMPARATOR HAVING REDUNDANCY AND SEPARATE READ AN CO PARE PATHS

[75] Inventor: Taisheng Feng, Austin, Tex.

[73] Assignee: Motorola Inc., Schaumburg, Ill.

[21] Appl. No.: 264,090

[22] Filed: Jun. 21, 1994

[51] Int. Cl.[6] .................................................. G11C 15/00
[52] U.S. Cl. ................ 365/189.07; 365/49; 365/189.02; 365/200; 365/230.02
[58] Field of Search ................................ 365/49, 189.07, 365/230.02, 200, 189.02; 395/425

[56] References Cited

U.S. PATENT DOCUMENTS

| | | | |
|---|---|---|---|
| 4,907,189 | 3/1990 | Branson et al. ......................... | 364/900 |
| 4,996,641 | 2/1991 | Talgam et al. .......................... | 364/200 |
| 5,031,141 | 7/1991 | Guddat et al. ................. | 365/189.07 X |
| 5,067,078 | 11/1991 | Talgam et al. .......................... | 395/400 |
| 5,184,320 | 2/1993 | Dye ................................. | 365/189.07 X |
| 5,280,449 | 1/1994 | Oldham ........................... | 365/189.07 X |

*Primary Examiner*—Do Hyun Yoo
*Attorney, Agent, or Firm*—Daniel D. Hill

[57] ABSTRACT

A cache TAG comparator (20) has a combined data multiplexer and compare circuit (30) for multiplexing redundant columns (26) with normal columns of memory cells and for comparing input data with a TAG address stored in a TAG array (21) for determining if data required by a data processing system is located in a corresponding cache memory. A BICMOS match logic circuit (40) receives a compare signal from each data multiplexer and compare circuit, and provides a logic high match signal indicating a cache hit in response to a logic state of the input data and the TAG address being identical. The comparison is performed in ECL, allowing high speed operation. Also, the match signal is generated prior to a critical read path, insuring faster generation of the match signal.

20 Claims, 3 Drawing Sheets

BICMO CACHE TAG COMPARATOR HAVING REDUNDANCY AND SEPARATE READ AN CO PARE PATHS

FIELD OF THE INVENTION

This invention relates generally to cache memories, and more particularly, to a BICMOS cache TAG comparator.

BACKGROUND OF THE INVENTION

A cache is a relatively small, high speed memory that is used to increase the speed of a data processing system. The access time of the cache is close to the central processing unit (CPU) logic propagation delay. The cache stores frequently used instructions or data to reduce the number of accesses between the CPU and a relatively slower main memory, thus improving system performance.

A cache TAG comparator is frequently used to increase the performance of the cache. The cache TAG comparator receives an address that is provided by the processor and determines if the requested instructions or data are present in the cache memory. Like the cache, the cache TAG comparator has an array of conventional static random access memory (SRAM) cells. A cache TAG comparator typically has two operating modes: write mode; and read/compare mode. When data is written into the cache memory, the higher order bits of the address of the data are stored in the TAG array. When in the read/compare mode, the cache TAG comparator compares a processor generated address to the TAG address. If the TAG address and the processor generated address are the same, a cache "hit" occurs, and a match signal of a predetermined logic state is provided by the cache TAG comparator, indicating that the requested data is located in the cache memory. If the processor generated address and the TAG address are not the same, a cache "miss" occurs, and a match signal of an opposite logic state is provided by the cache TAG comparator, indicating that the requested data is not located in the cache memory.

It is important for the match signal to be generated as quickly as possible after the cache TAG comparator receives the data to be compared. In some prior art cache TAG comparators, the read mode and the compare mode share the same data path, which results in increased gate delay before the match signal can the provided to the processor. Also, if redundancy is used to correct defects in the TAG array, the redundant path will also add delay to the time required to generate a match signal.

SUMMARY OF THE INVENTION

Accordingly, there is provided, in one form, a cache TAG comparator having a TAG array of memory cells, a redundant array of memory cells for replacing defective TAG array memory cells, a plurality of data multiplexers, a plurality of comparators, and a BICMOS match logic circuit. The plurality of data multiplexers are coupled to the array and to the redundant array, a data multiplexer of the plurality of data multiplexers provides a TAG address bit corresponding to the logic state of a selected one of the memory cells. The plurality of comparators are coupled to the plurality of data multiplexers, a comparator of the plurality of comparators is coupled to a data multiplexer of the plurality of data multiplexers. The comparator receives a TAG address bit and an input data bit, and provides a compare signal at an output terminal of a first logic state if a logic state of the TAG address bit is the same as a logic state of the input data bit, and provides the compare signal at a second logic state if the logic of the TAG address bit is not the same as the logic state of the input data bit. The BICMOS match logic circuit is coupled to the plurality of comparators. The BICMOS match logic circuit provides a match signal having a first logic state if all of the compare signals are of the same logic state, and provides the match signal at a second logic state if all of the compare signals are not the same logic state. These and other features and advantages will be more clearly understood from the following detailed description taken in conjunction with the accompanying drawings.

DESCRIPTION OF THE PREFERRED EMBODIMENT

Generally, the present invention provides a cache TAG comparator having an integrated, or combined, data multiplexing and compare circuit. The cache TAG comparator is for determining if data required by a data processing system is located in cache memory. The data multiplexing and compare circuit is for multiplexing redundant columns with normal columns of memory cells, and for comparing input data with a TAG address that is stored in a TAG array. The input data comprises the higher order address bits provided by a data processor. A BICMOS match logic circuit of the cache TAG comparator receives a compare signal from each data multiplexer and compare circuit, and provides a match signal in response to the input data and the TAG address from the TAG array having identical logic states. The comparison is done in ECL (emitter-coupled logic) thereby providing high speed operation. Also, the match signal is generated before the critical read path of the cache TAG comparator, insuring faster generation of the match signal.

Figure 1:
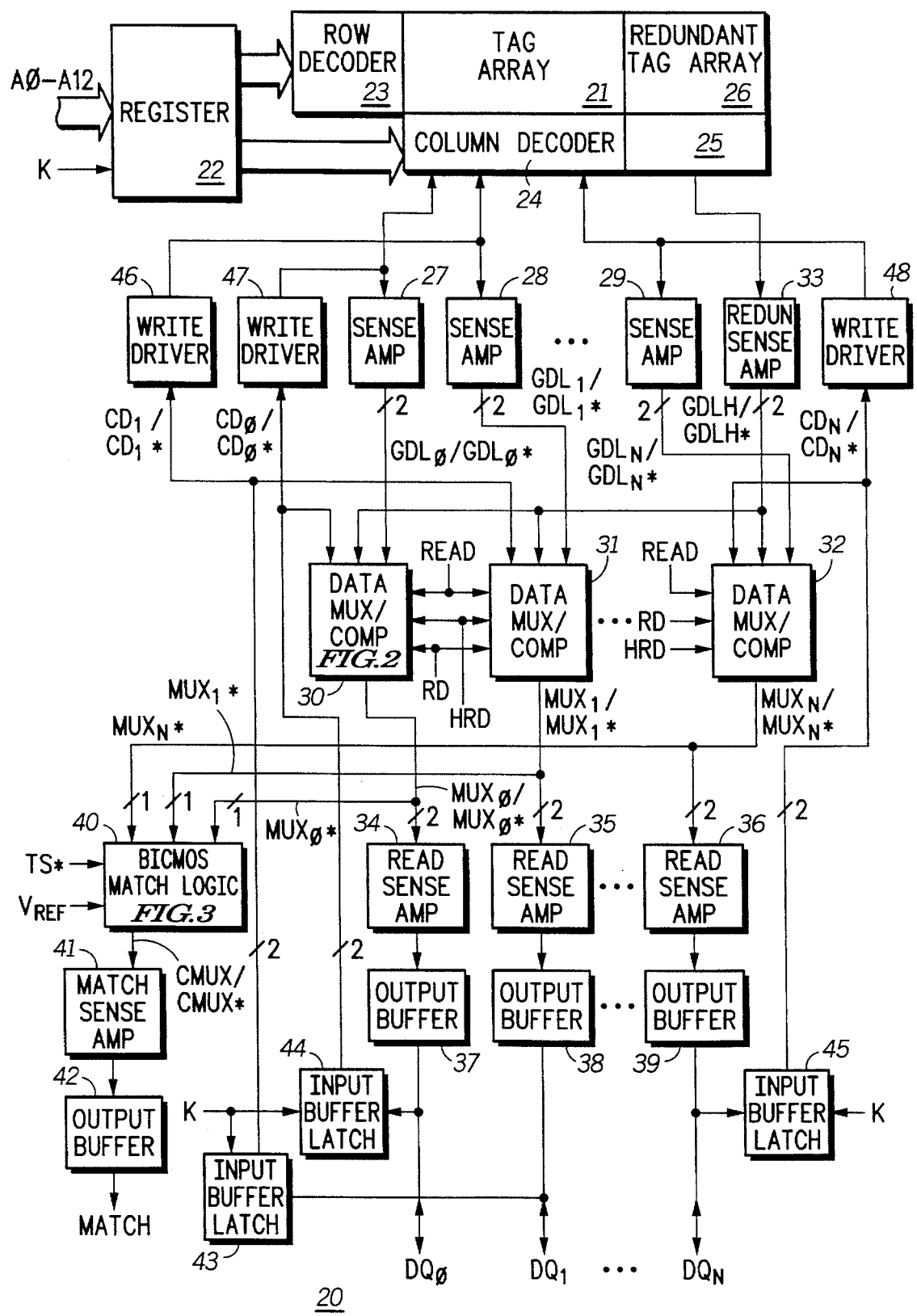
FIG. 1 illustrates in block diagram form, a cache TAG comparator in accordance with the present invention.

The present invention can be more fully described with reference to FIG. 1–3. FIG. 1 illustrates in block diagram form, cache TAG comparator 20 in accordance with the present invention. Cache TAG comparator 20 includes TAG array 21, address register 22, row decoder 23, column decoder 24, redundant column decoder 25, redundant TAG array 26, local sense amplifiers 27, 28, and 29, redundant sense amplifier 33, data multiplexing and compare circuits 30, 31, and 32, read sense amplifiers 34, 35, and 36, output buffers 37, 38, 39, and 42, BICMOS match logic circuit 40, match sense amplifier 41, input buffer/latches 43, 44, and 45, and write drivers 46, 47, and 48.

TAG array 21 includes an array of conventional SRAM cells organized in intersecting rows and columns. A word line and the memory cells coupled to the word line comprise a row of memory cells. A bit line pair and the memory cells coupled to the bit line pair comprise a column of memory cells. A memory cell is located at each intersection of the word lines and the bit line pairs. The memory cells of TAG array 21 are addressable through row decoding and column decoding, and each memory cell has a unique address at an intersection of a row and a column. In the illustrated embodiment, the word lines are coupled to row decoder 23, and each bit line pair is coupled to column decoder 24. Cache TAG 20 has redundant elements to replace defective elements of TAG array 21. Using redundancy improves yield by allowing a TAG array having a few defective elements to be repaired, thus lowering manufacturing costs. Redundant TAG array 26 has a relatively small number of redundant columns of memory cells to replace defective columns of TAG array 21.

Register 22 has first input terminals for receiving address signals labeled "A0–A12", a second input terminal for receiving a clock signal labeled "K", and output terminals coupled to row decoder and column decoder 24. Address signals A0–A12 are provided by a data processor (not shown) and comprise lower order address bits of an address. In response to receiving an address, row decoder 23 selects a word line and column decoder 24 couples a bit line pair to one of the local sense amplifiers 27, 28, 29. A TAG address bit is provided to each of local sense amplifiers 27, 28, 29.

If a redundant column has been used to replace a defective column of TAG array 21, redundant column decoder 25 couples a redundant bit line pair to redundant sense amplifier 33. Redundant sense amplifier 33 is coupled to one of data multiplexing and compare circuits 30, 31, or 32, depending on which column of TAG array 21 is defective. Note that column redundancy is known in the art, and therefore will not be discussed in detail, except as far as redundancy applies to the present invention.

Data multiplexing and compare circuit 30 has first input terminals coupled to output terminals of local sense amplifier 27 for receiving differential data signals labeled "$GDL_0$/$GDL_0$*", second input terminals coupled to output terminals of local redundant sense amplifier 33 for receiving differential redundant data signals labeled "GDLH/GDLH*", third input terminals for receiving differential input data bit signals labeled "$CD_0$/$CD_0$*", a fourth input terminal for receiving a control signal labeled "READ", a fifth input terminal for receiving a redundant control signal labeled "RD", a sixth input terminal for receiving a redundant control signal labeled "HRD", and output terminals for providing differential compare signals labeled "$MUX_0$/$MUX_0$*". Note that an asterisk (*) after a signal name indicates that the signal is a logical complement of a signal having the same name but lacking the asterisk (*).

Data multiplexing and compare circuit 31 has first input terminals coupled to output terminals of local sense amplifier 28 for receiving differential data signals labeled "$GDL_1$/$GDL_1$*", second input terminals coupled to output terminals of local redundant sense amplifier 33 for receiving differential redundant data signals GDLH/GDLH*, third input terminals for receiving differential input data bit signals labeled "$CD_1$/$CD_1$*", a fourth input terminal for receiving control signal READ, a fifth input terminal for receiving redundant control signal RD, a sixth input terminal for receiving redundant control signal HRD, and output terminals for providing differential compare signals labeled "$MUX_1$/$MUX_1$*".

Data multiplexing and compare circuit 32 has first input terminals coupled to output terminals of local sense amplifier 29 for receiving differential data signals labeled "$GDL_N$/$GDL_N$*", second input terminals coupled to output terminals of local redundant sense amplifier 33 for receiving differential redundant data signals GDLH/GDLH*, third input terminals for receiving differential input data bit signals labeled "$CD_N$/$CD_N$*", a fourth input terminal for receiving control signal READ, a fifth input terminal for receiving redundant control signal RD, a sixth input terminal for receiving redundant control signal HRD, and output terminals for providing differential compare signals labeled "$MUX_N$/$MUX_N$*".

Final sense amplifier 34 has input terminals for receiving differential compare signals $MUX_0$/$MUX_0$*, and output terminals. Final sense amplifier 35 has input terminals for receiving differential compare signals $MUX_1$/$MUX_1$*, and output terminals. Final sense amplifier 36 has input terminals for receiving differential compare signals $MUX_N$/$MUX_N$*, and output terminals.

Output buffer circuit 37 has input terminals coupled to the output terminals of read sense amplifier 34, and an output terminal labeled "$DQ_0$". Output buffer circuit 38 has input terminals coupled to the output terminals of read sense amplifier 35, and an output terminal labeled "$DQ_1$". Output buffer circuit 39 has input terminals coupled to the output terminals of read sense amplifier 36, and an output terminal labeled "$DQ_N$".

Input buffer/latch 43 has a first input terminal for receiving clock signal K, a second input terminal coupled to output terminal $DQ_1$, and output terminals coupled to the third input terminals of data multiplexing and compare circuit 31 for providing differential input data bit signals $CD_1$/$CD_1$*. Input buffer/latch 44 has a first input terminal for receiving clock signal K, a second input terminal coupled to output terminal $DQ_0$, and output terminals coupled to the third input terminals of data multiplexing and compare circuit 30 for providing differential input data bit signals $CD_0$/$CD_0$*. Input buffer/latch 45 has a first input terminal for receiving clock signal K, a second input terminal coupled to output terminal $DQ_N$, and output terminals coupled to the third input terminals of data multiplexing and compare circuit 32 for providing differential input data bit signals $CD_N$/$CD_N$*.

Write driver 46 has input terminals coupled to the output terminals of input buffer/latch 43 for receiving differential input data bit signals $CD_1$/$CD_1$*, and output terminals coupled to the column decoder 24. Write driver 47 has input terminals coupled to the output terminals of input buffer/latch 44 for receiving differential input data bit signals $CD_0$/$CD_0$*, and output terminals coupled to the column decoder 24. Write driver 48 has input terminals coupled to the output terminals of input buffer/latch 45 for receiving differential input data bit signals $CD_N$/$CD_N$*, and output terminals coupled to the column decoder 24.

BICMOS match logic circuit 40 has a first input terminal coupled to an output terminal of data multiplexing and compare circuit 30 for receiving compare signal $MUX_0$*, a second input terminal coupled to an output terminal of data multiplexing and compare circuit 31 for receiving compare signal $MUX_1$*, a third input terminal coupled to an output terminal of data multiplexing and compare circuit 32 for receiving compare signal $MUX_N$*, a fourth input terminal for receiving TAG select signal TS*, a fifth input terminal for receiving a reference voltage labeled "$V_{REF}$", and output terminals for providing differential match signals labeled "CMUX/CMUX"*. Sense amplifier 41 has input terminals coupled to the output terminals of BICMOS match logic circuit 40, and an output terminal. Output buffer circuit 42 has an input terminal coupled to the output terminal of match sense amplifier 41, and an output terminal for providing a match signal labeled "MATCH".

In a preferred embodiment, TAG array 21 is an 8K×16 BICMOS SRAM array. Data is organized as a 15 bit TAG address and a valid bit. However, in other embodiments, TAG array 21 may be another type of memory array having a different data organization, or word width. In a compare mode, cache TAG comparator 20 receives an address comprised of lower order address signals A0–A12 from a data processor (not shown). In response to receiving address signals A0–A12, TAG array 21 provides a 16 bit word comprising the 15 bit TAG address and the valid bit. The valid bit is set as a prerequisite to obtaining a valid cache hit. Each bit of the 16 bit word is provided to a local sense amplifier, illustrated in FIG. 1 as local sense amplifiers 27, 28, and 29. Local sense amplifiers 27, 28, and 29 sense and amplify the relatively small differential signals provided to each bit line pair. If redundant columns from redundant array 26 have been used to replace a defective column of TAG array 21, then redundant local sense amplifier 33 replaces one of local sense amplifiers 27, 28, and 29, whichever one is coupled to the defective column of memory cells.

Data multiplexer and compare circuits 30, 31, and 32 receive data signals from local sense amplifiers 27, 28, and 29 and from redundant sense amplifier 33 if redundant sense amplifier 33 is used to replace a normal local sense amplifier. The logic state of redundant control signals RD and HRD determine whether redundancy has been used. Redundant control signals RD and HRD will be discussed later in more detail with the discussion of FIG. 2. A predetermined number of input data signals is provided to data input/output terminals $DQ_0$, $DQ_1$ through $DQ_N$. The input data signals are rail-to-rail CMOS level signals. The predetermined number of input data signals is equal to the number of TAG address bits provided by TAG array 21, and are the higher order address bits of an address provided by the data processor. The input data signals are latched in input buffer/latch circuits 43, 44, through 45, and provided to data multiplexer and compare circuits 30, 31, and 32 in response to clock signal K. Each of data multiplexer and compare circuits 30, 31, and 32 compare logic states of the input data signals and the TAG address bits, and outputs a logic high differential compare signal if the input data signal is the same logic state as the logic state of the TAG address bits.

The differential compare signals are provided to read sense amplifiers 34, 35, and 36. The differential signals have a true signal portion and a complement signal portion. BICMOS match logic circuit 40 receives the complement portion of the compare signals, and uses wired-OR logic to determine the logic state of the match signal. If all of the complement compare signals are logic low, then BICMOS match logic circuit 40 provides a logic high match signal CMUX/CMUX* to match sense amplifier 41. Output buffer 42 provides a logic high match signal MATCH to the data processor indicating the requested information is located in the cache memory. If all of the complement compare signals are not a logic low, the BICMOS match logic circuit 40 provides a logic low match signal CMUX/CMUX* to match sense amplifier 41. Output buffer 42 provides a logic low match signal MATCH to the data processor indicating that the requested information is not located in the cache memory (a cache miss), and that an access of main memory is necessary to retrieve required data or instructions.

In cache TAG comparator 20, the comparison of the input data signals to the address bit signals occurs immediately after local sense amplifiers 27, 28, and 29, when the address bit signal swing is relatively small. Also, the redundant, normal and comparison data paths are combined in the same multiplexing and compare circuits, resulting in less gate delay and more efficient use of surface area of an integrated circuit. In addition, BICMOS match logic circuit 40 uses wired-OR logic to generate the match signal relatively early in the output data path. Match sense amplifier 41 is in a "critical path", and because there is only one match sense amplifier circuit, the circuit design of match sense amplifier 41 can be optimized for high speed operation rather than for low power consumption.

When logic low match signal MATCH is provided to the data processor, indicating that the requested data is not located in cache memory, new data is loaded into cache memory from a main memory. When the new data is loaded into cache memory, the addresses associated with the new data are written into, and stored, in TAG array 21. Also, the valid bit is set, allowing a valid cache hit when the data is requested. In the write mode, input buffers/latches 43, 44, and 45 receive data input signals from terminals $DQ_0$, $DQ_1$, and $DQ_N$, and provide output data signals having the same logic states to write drivers 46, 47, and 48. Write drivers 46, 47, and 48 drive data onto the bit line pairs in TAG array 21 to locations selected by the logic states of address signals A0–A12. If a redundant column is to be written to, a redundant write driver (not shown) is used to provide data to the selected cells of the redundant column.

Figure 2:
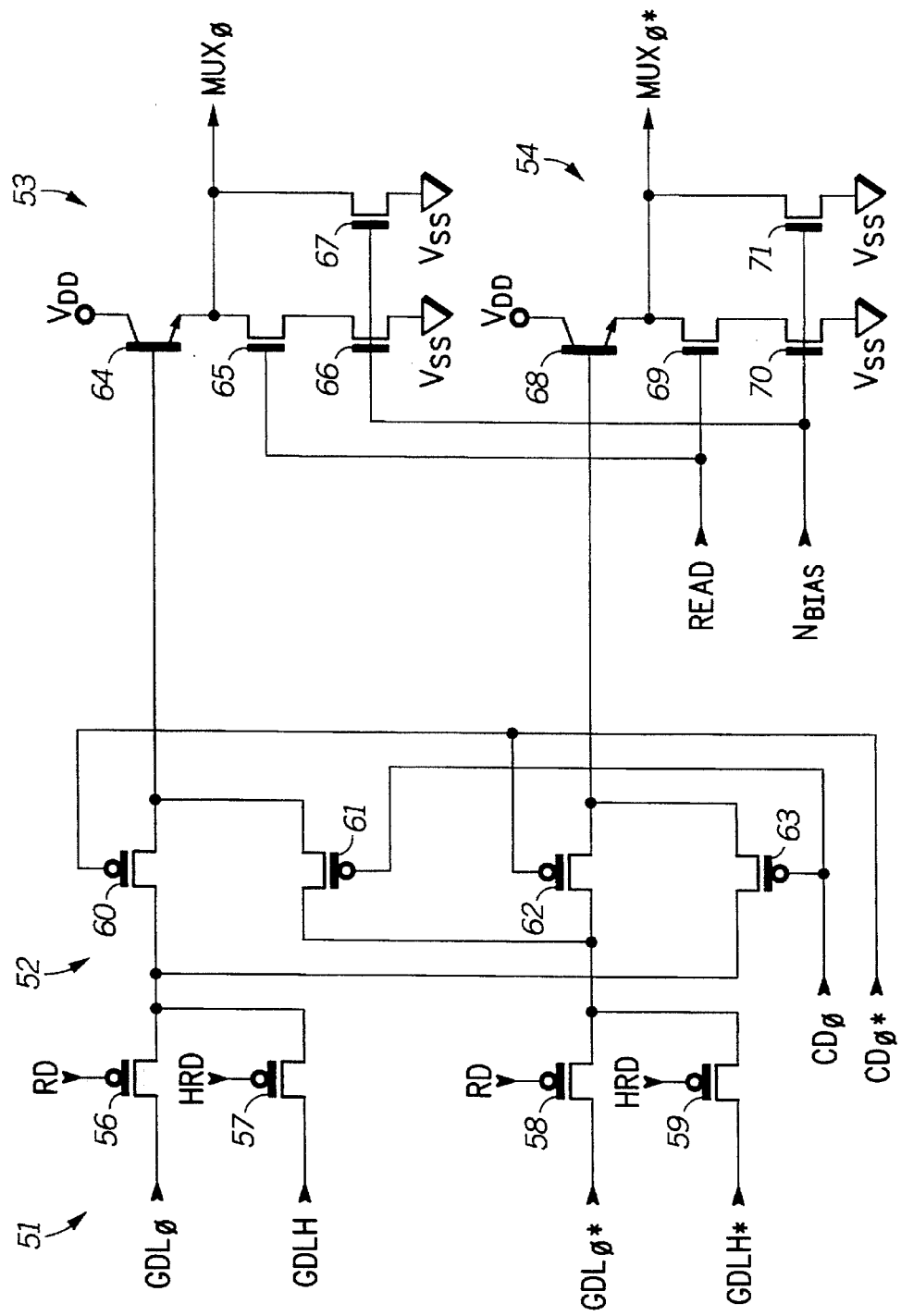
FIG. 2 illustrates in schematic diagram form, a data multiplexing and compare circuit of the cache TAG comparator of FIG. 1.

FIG. 2 illustrates in schematic diagram form, data multiplexing and compare circuit of cache TAG comparator 30 of FIG. 1. Data multiplexing and compare circuit 30 includes multiplexer portion 51, comparator portion 52, and BICMOS drivers 53, and 54. Note that a BICMOS integrated circuit is a circuit that includes bipolar transistors and CMOS (complementary metal-oxide semiconductor) transistors on the same integrated circuit. Multiplexer portion 51 includes P-channel transistors 56–59. Comparator portion 52 includes P-channel transistors 60–63. BICMOS driver 53 includes NPN transistor 64 and N-channel transistors 65–67. BICMOS driver 54 includes NPN transistor 68 and N-channel transistors 69–71.

P-channel transistor 56 has a first source/drain terminal for receiving data signal $GDL_0$, a gate for receiving control signal RD, and a second source/drain terminal. P-channel transistor 57 has a first source/drain terminal for receiving data signal GDLH, a gate for receiving control signal HRD, and a second source/drain terminal connected to the second source/drain terminal of P-channel transistor 56. P-channel transistor 58 has a first source/drain terminal for receiving data signal $GDL_0$*, a gate for receiving control signal RD, and a second source/drain terminal. P-channel transistor 59 has a first source/drain terminal for receiving data signal GDLH*, a gate for receiving control signal HRD, and a second source/drain terminal connected to the second source/drain terminal of P-channel transistor 58.

P-channel transistor 60 has a first source/drain terminal connected to the second source/drain terminal of P-channel transistor 56, a gate for receiving input data bit signal $CD_0$*, and a second source/drain terminal. P-channel transistor 61 has a first source/drain terminal connected to the second source/drain terminal of P-channel transistor 60, a gate for receiving input data bit signal $CD_0$, and a second source/drain terminal connected to the second source/drain terminal of P-channel transistor 58. P-channel transistor 62 has a first source/drain terminal connected to the second source/drain terminal of P-channel transistor 58, a gate for receiving input data bit signal $CD_0$*, and a second source/drain terminal. P-channel transistor 63 has a first source/drain terminal connected to the second source/drain terminal of P-channel transistor 62, a gate for receiving input data bit signal $CD_0$, and a second source/drain terminal connected to the second source/drain terminal of P-channel transistor 56.

NPN transistor 64 has a collector connected to $V_{DD}$, a base connected to the second source/drain terminal of P-channel transistor 60, and an emitter for providing data signal $MUX_0$. N-channel transistor 65 has a drain connected to the emitter of NPN transistor 64, a gate for receiving control signal READ, and a source. N-channel transistor 66 has a drain connected to the source of N-channel transistor

65, a gate for receiving bias voltage $N_{BIAS}$, and a source connected to $V_{SS}$. N-channel transistor 67 has a drain connected to the emitter of NPN transistor 64, a gate for receiving bias voltage $N_{BIAS}$, and a source connected to $V_{SS}$.

NPN transistor 68 has a collector connected to $V_{DD}$, a base connected to the second source/drain terminal of P-channel transistor 62, and an emitter for providing data signal $MUX_0^*$. N-channel transistor 69 has a drain connected to the emitter of NPN transistor 68, a gate for receiving control signal READ, and a source. N-channel transistor 70 has a drain connected to the source of N-channel transistor 69, a gate for receiving bias voltage $N_{BIAS}$, and a source connected to $V_{SS}$. N-channel transistor 71 has a drain connected to the emitter of NPN transistor 68, a gate for receiving bias voltage $N_{BIAS}$, and a source connected to $V_{SS}$.

During the compare mode, data multiplexer and compare circuit 30 receives differential data signals $GDL_0$ and $GDL_0^*$ from sense amplifier 27 and redundant data signals GDLH and GDLH* from redundant sense amplifier 33. Differential data signals $GDL_0$ and $GDL_0^*$ have a relatively small signal swing. If redundant control signal RD is a logic low and redundant control signal HRD is a logic high, P-channel transistors 56 and 58 are conductive, and P-channel transistors 57 and 59 are non-conductive, allowing differential data signals $GDL_0$ and $GDL_0^*$ to be provided to comparator portion 52. If redundant control signal HRD is a logic low and redundant control signal RD is a logic high, a redundant column is being used to replace a defective column in TAG array 21, and P-channel transistors 57 and 59 are conductive, allowing redundant data signal GDLH and GDLH* to be provided to comparator portion 52. In comparator portion 52, the logic states of the data signals provided by multiplexer portion 51 are compared to logic states of differential input data signals $CD_0/CD_0^*$ using exclusive-NOR logic. If both signals have the same logic state, either a logic "one" or a logic "zero", then compare circuit 52 provides a logic high (logic one) to BICMOS driver 53 and a logic low (logic zero) to BICMOS driver 54. During the compare mode, control signal READ is a logic high, activating BICMOS drivers 53 and 54. NPN transistors 64 and 68 are emitter-follower transistors, so that the emitter voltage "follows" the base voltage minus one $V_{BE}$ (a base-emitter diode voltage drop). A logic high to the base of emitter-follower NPN transistor 64 results in compare signal $MUX_0$ being provided as a logic high voltage. Likewise, a logic low voltage is provided to the base of NPN transistor 68 causing the emitter voltage of NPN transistor 68 to be a logic low voltage. N-channel transistors 69, 70, and 71 are conductive, causing the voltage of compare signal $MUX_0^*$ to be reduced to a logic low voltage. Bias voltage $N_{BIAS}$ causes N-channel transistors 70 and 71 to provide relatively constant current sources.

By integrating redundant, normal, and comparison functions, and by performing the comparison on signals having relatively small signal swings, a compare signal is generated more quickly.

Figure 3:
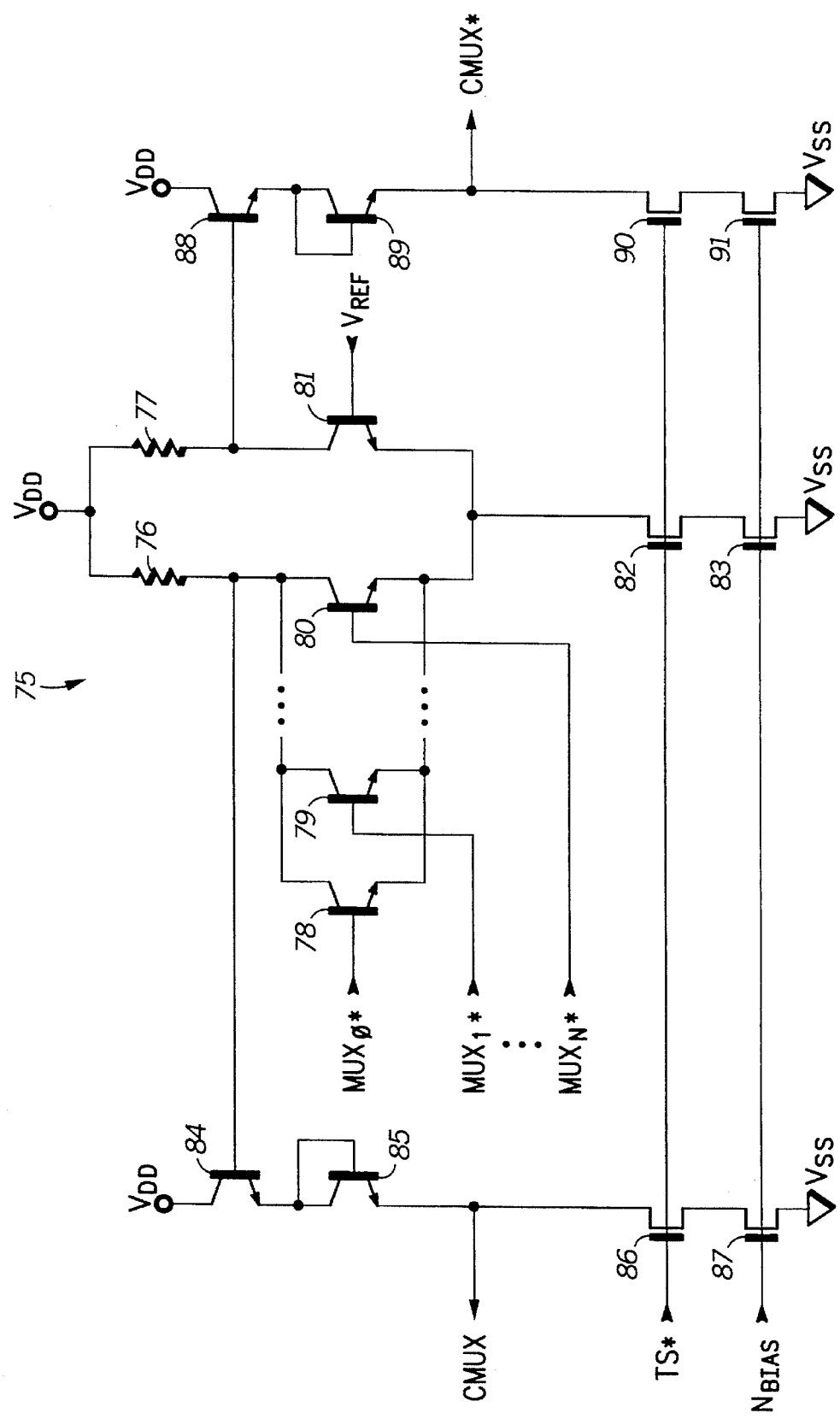
FIG. 3 illustrates in schematic diagram form, a BICMOS match logic circuit of the cache TAG comparator of FIG. 1.

FIG. 3 illustrates in schematic diagram form, BICMOS match logic circuit 40 of cache TAG comparator 20 of FIG. 1. BICMOS match logic circuit 40 includes differential amplifier 75, NPN transistors 84, 85, 88, and 89, and N-channel transistors 86, 87, 90, and 91. Differential amplifier 75 includes resistors 76 and 77, NPN transistors 78, 79, 80, and 81, and N-channel transistors 82 and 83.

Resistor 76 has a first terminal connected to $V_{DD}$, and a second terminal. Resistor 77 has a first terminal connected to $V_{DD}$, and a second terminal. NPN transistor 78 has a collector connected to the second terminal of resistor 76, a base for receiving signal $MUX_0^*$, and an emitter. NPN transistor 79 has a collector connected to the second terminal of resistor 76, a base for receiving signal $MUX_1^*$, and an emitter connected to the emitter of NPN transistor 78. NPN transistor 80 has a collector connected to the second terminal of resistor 76, a base for receiving signal $MUX_1^*$, and an emitter connected to the emitters of NPN transistors 78 and 79. NPN transistor 81 has a collector connected to the second terminal of resistor 77, a base for receiving a reference voltage labeled "$V_{REF}$", and an emitter connected to the emitters of NPN transistors 78, 79, and 80. N-channel transistor 82 has a drain connected to the emitters of NPN transistors 78, 79, 80, and 81, a gate for receiving TAG select signal TS*, and a source. N-channel transistor 83 has a drain connected to the source of N-channel transistor 82, a gate for receiving a bias voltage labeled "$N_{BIAS}$", and a source connected to $V_{SS}$.

NPN transistor 84 has a collector connected to $V_{DD}$, a base connected to the second terminal of resistor 76, and an emitter. NPN transistor 85 is diode connected, having a base and a collector connected to the emitter of NPN transistor 84, and an emitter for providing signal CMUX. N-channel transistor 86 has a drain connected to the emitter of NPN transistor 85, a gate for receiving TAG select signal TS*, and a source. N-channel transistor 87 has a drain connected to the source of N-channel transistor 86, a gate for receiving bias voltage $N_{BIAS}$, and a source connected to $V_{SS}$.

NPN transistor 88 has a collector connected to $V_{DD}$, a base connected to the second terminal of resistor 77, and an emitter. NPN transistor 89 is diode connected, having a base and a collector connected to the emitter of NPN transistor 88, and an emitter for providing signal CMUX*. N-channel transistor 90 has a drain connected to the emitter of NPN transistor 89, a gate for receiving TAG select signal TS*, and a source. N-channel transistor 91 has a drain connected to the source of N-channel transistor 90, a gate for receiving bias voltage $N_{BIAS}$, and a source connected to $V_{SS}$.

In compare mode, TAG select signal TS* is a logic high, causing N-channel transistors 86, 82, and 90 to be conductive. Bias voltage $N_{BIAS}$ causes N-channel transistors 87, 83, and 91 to function as current sources. NPN transistors 78, 79, and 80 of differential amplifier 75 are wired-OR connected for receiving complement signals $MUX_0^*$, $MUX_1^*$, and $MUX_N^*$ of differential compare signals $MUX_0/MUX_0^*$, $MUX_1/MUX_1^*$, and $MUX_N/MUX_N^*$. NPN transistor 81 receives reference voltage $V_{REF}$. Reference voltage $V_{REF}$ is provided at about the midpoint of a logic swing of differential compare signals $MUX_0/MUX_0^*$, $MUX_1/MUX_1^*$, and $MUX_N/MUX_N^*$. If any of complement compare signals $MUX_0^*$, $MUX_1^*$, and $MUX_N^*$ is a logic high voltage, more current is steered through resistor 76 than through resistor 77. The voltage at the second terminal of resistor 76 is a logic low voltage, causing emitter-follower NPN transistor 84 to provide a logic low voltage equal to about the voltage at the second terminal of resistor 76 minus one $V_{BE}$. Emitter-follower NPN transistor 88 provides a logic high voltage equal to about the voltage at the second terminal of resistor 77 minus one $V_{BE}$. Match signal CMUX is a logic low and match signal CMUX* is a logic high, indicating a cache miss. If all of complement signals $MUX_0^*$, $MUX_1^*$, and $MUX_N^*$ are each a logic low voltage, more current is steered through resistor 77 than through resistor 76. The emitter voltage of NPN transistor 88 is a logic low and the emitter voltage of NPN transistor 84 is a logic high. Thus, match signal CMUX* is a logic low voltage and match signal CMUX is a logic high voltage, indicating a cache hit. Diode-connected NPN transistors 85 and 89 provide a level shifting function, causing the voltage of differential match signals CMUX and CMUX* to be one $V_{BE}$ below the voltage at the emitters of NPN transistors 84 and 88.

During write mode, or when cache TAG comparator 20 is inactive, TAG select signal TS* is a logic low voltage, causing N-channel transistors 86, 82, and 90 to be substantially non-conductive, deactivating BICMOS match logic circuit 40.

Differential compare signals $MUX_0/MUX_0^*$, $MUX_1/MUX_1^*$, and $MUX_N/MUX_N^*$ have a relatively small signal swing. By locating data multiplexer and compare circuits 30, 31, and 32 before read sense amplifiers 34, 35, and 36 and comparing address bit signals having a relatively small signal swing in order to generate a match signal, the match signal can be generated more rapidly.

While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true spirit and scope of the invention.

What is claimed is:

1. A cache TAG comparator, comprising:

a TAG array of memory cells;

a redundant array of memory cells for replacing defective memory cells of the TAG array;

a plurality of data multiplexers, coupled to the TAG array and to the redundant array, a data multiplexer of the plurality of data multiplexers providing a TAG address bit having a logic state corresponding to the logic state of a selected one of the memory cells of either of the TAG array and the redundant array;

a plurality of comparators, coupled to the plurality of data multiplexers, a comparator of the plurality of comparators coupled to a data multiplexer of the plurality of data multiplexers, the comparator receiving the TAG address bit and an input data bit, and providing a compare signal at an output terminal of a first logic state if the logic state of the TAG address bit is the same as a logic state of the input data bit, and providing the compare signal at a second logic state if the logic state of the TAG address bit is not the same as the logic state of the input data bit; and a BICMOS match logic circuit, coupled to the plurality of comparators, the BICMOS match logic circuit providing a match signal having the first logic state if all of the compare signals are a same logic state, and providing the match signal at the second logic state if all of the compare signals are not the same logic state.

2. The cache TAG comparator of claim 1, wherein the TAG array of memory cells comprises an array of static random access memory cells.

3. The cache TAG comparator of claim 1, wherein the BICMOS match logic circuit comprises a differential amplifier having first and second resistors and a plurality of bipolar transistors, a base of a bipolar transistor of the plurality of bipolar transistors coupled to the output terminal of the comparator of the plurality of comparators.

4. The cache TAG comparator of claim 3, further comprising:

a sense amplifier having an input terminal coupled to the output terminal of the comparator of the plurality of comparators, and an output terminal; and an output buffer having an input terminal coupled to the output terminal of the sense amplifier, and an output terminal.

5. The cache TAG comparator of claim 1, wherein the data multiplexer comprises:

a first P-channel transistor having a first source/drain terminal for receiving a first TAG address bit signal from a selected memory cell of the TAG array of memory cells, a gate for receiving a first control signal, and a second source/drain terminal;

a second P-channel transistor having a first source/drain terminal coupled to the redundant array, a gate for receiving a second control signal, and a second source/drain terminal coupled to the second source/drain terminal of the first P-channel transistor;

a third P-channel transistor having a first source/drain terminal for receiving a second TAG address bit signal from a selected memory cell of the TAG array of memory cells, the second TAG address bit signal being a logical complement of the first TAG address bit signal, a gate for receiving the first control signal, and a second source/drain terminal; and a fourth P-channel transistor having a first source/drain terminal coupled to the redundant array, a gate for receiving the second control signal, and a second source/drain terminal coupled to the second source/drain terminal of the third P-channel transistor.

6. The cache TAG comparator of claim 5, wherein the comparator comprises:

a fifth P-channel transistor having a first source/drain terminal coupled to the second source/drain terminal of the first P-channel transistor, a gate for receiving a first input data bit signal, and a second source/drain terminal;

a sixth P-channel transistor having a first source/drain terminal coupled to the second source/drain terminal of the fifth P-channel transistor, a gate for receiving a second input data bit signal, the second input data bit signal being a logical complement of the first input data bit signal, and a second source/drain terminal coupled to the second source/drain terminal of the third P-channel transistor;

a seventh P-channel transistor having a first source/drain terminal coupled to the second source/drain terminal of the third P-channel transistor, a gate coupled to the gate of the fifth P-channel transistor, and a second source/drain terminal; and an eighth P-channel transistor having a first source/drain terminal coupled to the first source/drain terminal of the fifth P-channel transistor, a gate coupled to the gate of the sixth P-channel transistor, and a second source/drain terminal coupled to the second source/drain terminal of the seventh P-channel transistor.

7. A cache TAG comparator, comprising:

a TAG memory array for providing a predetermined number of TAG address bits in response to receiving an address;

a plurality of local sense amplifiers, a local sense amplifier of the plurality of local sense amplifiers having an input terminal coupled to the TAG memory array for receiving one TAG address bit of the predetermined number of TAG address bits, and an output terminal;

a plurality of comparators, a comparator of the plurality of comparators having a first input terminal coupled to the output terminal of the local sense amplifier, a second input terminal for receiving an input data bit of a plurality of input data bits, the comparator comparing a logic state of the one TAG address bit to a logic state of the input data bit, the comparator having an output terminal for providing a compare signal of a first logic state if the logic state of the one TAG address bit is the same as the logic state of the input data bit, and the comparator providing the compare signal at a second logic state if the logic state of the one TAG address bit is not the same as the logic state of the input data bit; and a BICMOS match logic circuit having a plurality of input terminals, each input terminal of the plurality of input terminals directly coupled to the output terminal of each comparator of the plurality of comparators, the BICMOS match logic circuit for comparing the compare signals of the plurality of comparators, and the BICMOS match logic circuit having an output terminal for providing a match signal if the compare signals from the plurality of comparators are the same logic state.

8. The cache TAG comparator of claim 7, wherein the TAG memory array is an array of static random access memory cells.

9. The cache TAG comparator of claim 7, further comprising a plurality of redundant columns of memory cells for replacing defective columns of the TAG memory array.

10. The cache TAG comparator of claim 9, wherein the one TAG address bit is characterized as being true and complement TAG address bit signals, and the input data bit is characterized as being true and complement input data bit signals.

11. The cache TAG comparator of claim 10, further comprising a data multiplexer, the data multiplexer comprising:

a first P-channel transistor having a first source/drain terminal for receiving the true TAG address bit signal, a gate for receiving a first redundancy control signal, and a second source/drain terminal;

a second P-channel transistor having a first source/drain terminal coupled to the plurality of redundant columns, a gate for receiving a second redundancy control signal, and a second source/drain terminal coupled to the second source/drain terminal of the first P-channel transistor;

a third P-channel transistor having a first source/drain terminal for receiving the complement TAG address bit signal, a gate for receiving the first redundancy control signal, and a second source/drain terminal; and a fourth P-channel transistor having a first source/drain terminal coupled to the plurality of redundant columns, a gate for receiving the second redundancy control signal, and a second source/drain terminal coupled to the second source/drain terminal of the third P-channel transistor.

12. The cache TAG comparator of claim 11, wherein the comparator comprises:

a fifth P-channel transistor having a first source/drain terminal coupled to the second source/drain terminal of the first P-channel transistor, a gate for receiving the complement input data bit signal, and a second source/drain terminal;

a sixth P-channel transistor having a first source/drain terminal coupled to the second source/drain terminal of the fifth P-channel transistor, a gate for receiving the true input data bit signal, and a second source/drain terminal coupled to the second source/drain terminal of the third P-channel transistor;

a seventh P-channel transistor having a first source/drain terminal coupled to the second source/drain terminal of the third P-channel transistor, a gate coupled to the gate of the fifth P-channel transistor, and a second source/drain terminal; and an eighth P-channel transistor having a first source/drain terminal coupled to the first source/drain terminal of the fifth P-channel transistor, a gate coupled to the gate of the sixth P-channel transistor, and a second source/drain terminal coupled to the second source/drain terminal of the seventh P-channel transistor.

13. The cache TAG comparator of claim 12, further comprising a BICMOS driver circuit, the BICMOS driver circuit comprising:

a first bipolar transistor having a collector coupled to a first power supply voltage terminal, a base coupled to the second source/drain terminal of the fifth P-channel transistor, and an emitter;

a first N-channel transistor having a drain coupled to the emitter of the first bipolar transistor, a gate for receiving a compare mode control signal, and source;

a second N-channel transistor having a drain coupled to the source of the first N-channel transistor, a gate for receiving a bias voltage, and a source coupled to a second power supply voltage terminal; and a third N-channel transistor having a drain coupled to the emitter of the bipolar transistor, a gate for receiving the bias voltage, and a source coupled to the second power supply voltage terminal.

14. The cache TAG comparator of claim 7, wherein the BICMOS match logic circuit comprises:

a first resistor having a first terminal coupled to a first power supply voltage terminal, and a second terminal;

a second resistor having a first terminal coupled the first power supply voltage terminal, and a second terminal;

a plurality of first NPN transistors, each first NPN transistor of the plurality of first NPN transistors having a collector coupled to the second terminal of the first resistor, a base coupled to the output terminal of one of the plurality of comparators, and an emitter, each emitter of the plurality of first NPN transistors coupled together;

a second NPN transistor having a collector coupled to the second terminal of the second resistor, a base for receiving a reference voltage, and an emitter coupled to the emitters of the plurality of first NPN transistors;

a first N-channel transistor having a drain coupled to the emitters of the plurality of first NPN transistors, a gate for receiving a TAG select control signal, and a source; and a second N-channel transistor having a drain coupled the source of the first N-channel transistor, a gate for receiving a bias voltage, and a source coupled to a second power supply voltage terminal.

15. The cache TAG comparator of claim 14, wherein the BICMOS match logic circuit further comprises:

an emitter-follower transistor having a collector coupled to the first power supply voltage terminal, a base coupled to the second terminal of the second resistor, and an emitter;

a diode-connected transistor having a collector and a base coupled to the emitter of the emitter-follower transistor, and an emitter;

a third N-channel transistor having a drain coupled to the emitter of the diode-connected transistor, a gate for receiving the TAG select control signal, and a source; and a fourth N-channel transistor having a drain coupled to the source of the third N-channel transistor, a gate for receiving the bias voltage, and a source coupled to the second power supply voltage terminal.

16. A cache TAG comparator, comprising:

an array of memory cells arranged in intersecting rows and columns, the array for storing a TAG address of a predetermined number of bits, the array providing the TAG address of the predetermined number of bits in response to receiving an address;

a plurality of redundant columns of memory cells, a redundant column of memory cells for replacing a defective column of the array;

a plurality of local sense amplifiers of the predetermined number, a local sense amplifier of the plurality of local sense amplifiers having an input terminal coupled to the array of memory cells, and an output terminal for providing a TAG address bit signal corresponding to a TAG address bit of the predetermined number of bits;

a redundant local sense amplifier having an input terminal coupled to the plurality of redundant columns of memory cells, and an output terminal for providing a redundant TAG address bit signal if a redundant column has replaced a defective column of the array;

a plurality of data multiplexing and compare circuits of the predetermined number, a data multiplexing and compare circuit of the plurality of data multiplexing and compare circuits having a first input terminal for receiving the TAG address bit signal, a second input terminal coupled to the redundant local sense amplifier for receiving the redundant TAG address bit signal, a third input terminal for receiving an input data signal, the data multiplexing and compare circuit for comparing either the TAG address bit signal or the redundant TAG address bit signal to the input data signal in response to a redundant control signal, the data multiplexing and compare circuit having an output terminal for providing a compare signal of a first logic state if a logic state of the TAG address bit signal or the redundant TAG address bit signal is the same as a logic state of the input data signal, and the data multiplexing and compare circuit providing the compare signal at a second logic state if the logic state of the TAG address bit signal or the redundant TAG address bit signal is not the same as the logic state of the input data signal; and a BICMOS match logic circuit having a plurality of input terminals, each of the plurality of input terminals coupled to the output terminal of each of the plurality of data multiplexing and compare circuits, the BICMOS match logic circuit having an output terminal for providing a match signal if the compare signals of the plurality of data multiplexing and compare circuits are the same logic state.

17. The cache TAG comparator of claim 16, wherein the TAG address bit signal is characterized as being first and second differential TAG address bit signals, the redundant TAG address bit signal is characterized as first and second differential redundant TAG address bit signals, and the input data signal being characterized as being first and second differential input data signals.

18. The cache TAG comparator of claim 17, wherein the data multiplexing and compare circuit comprises:

a first P-channel transistor having a first source/drain terminal for receiving the first differential TAG address bit signal, a gate for receiving a first redundancy control signal, and a second source/drain terminal;

a second P-channel transistor having a first source/drain terminal coupled to the plurality of redundant columns, a gate for receiving a second redundancy control signal, and a second source/drain terminal coupled to the second source/drain terminal of the first P-channel transistor;

a third P-channel transistor having a first source/drain terminal for receiving the second differential TAG address bit signal, a gate for receiving the first redundancy control signal, and a second source/drain terminal;

a fourth P-channel transistor having a first source/drain terminal coupled to the plurality of redundant columns, a gate for receiving the second redundancy control signal, and a second source/drain terminal coupled to the second source/drain terminal of the third P-channel transistor;

a fifth P-channel transistor having a first source/drain terminal coupled to the second source/drain terminal of the first P-channel transistor, a gate for receiving the second input data signal, and a second source/drain terminal;

a sixth P-channel transistor having a first source/drain terminal coupled to the second source/drain terminal of the fifth P-channel transistor, a gate for receiving the first input data signal, and a second source/drain terminal coupled to the second source/drain terminal of the third P-channel transistor;

a seventh P-channel transistor having a first source/drain terminal coupled to the second source/drain terminal of the third P-channel transistor, a gate coupled to the gate of the fifth P-channel transistor, and a second source/drain terminal; and an eighth P-channel transistor having a first source/drain terminal coupled to the first source/drain terminal of the fifth P-channel transistor, a gate coupled to the gate of the sixth P-channel transistor, and a second source/drain terminal coupled to the second source/drain terminal of the seventh P-channel transistor.

19. The cache TAG comparator of claim 16, wherein the BICMOS match logic circuit comprises:

a first resistor having a first terminal coupled to a first power supply voltage terminal, and a second terminal;

a second resistor having a first terminal coupled to the first power supply voltage terminal, and a second terminal;

a plurality of first NPN transistors, each first NPN transistor of the plurality of first NPN transistors having a collector coupled to the second terminal of the first resistor, a base coupled to the output terminal of one of the plurality of data multiplexing and compare circuits, and an emitter, each emitter of the plurality of first NPN transistors coupled together;

a second NPN transistor having a collector coupled to the second terminal of the second resistor, a base for receiving a reference voltage, and an emitter coupled to the emitters of the plurality of first NPN transistors;

a first N-channel transistor having a drain coupled to the emitters of the plurality of first NPN transistors, a gate for receiving a TAG select control signal, and a source; and a second N-channel transistor having a drain coupled to the source of the first N-channel transistor, a gate for receiving a bias voltage, and a source coupled to a second power supply voltage terminal.

20. The cache TAG comparator of claim 19, wherein the BICMOS match logic circuit further comprises:

an emitter-follower transistor having a collector coupled to the first power supply voltage terminal, a base coupled to the second terminal of the second resistor, and an emitter;

a diode-connected transistor having a collector and a base coupled to the emitter of the emitter-follower transistor, and an emitter;

a third N-channel transistor having a drain coupled to the emitter of the diode-connected transistor, a gate for receiving the TAG select control signal, and a source; and a fourth N-channel transistor having a drain coupled to the source of the third N-channel transistor, a gate for receiving the bias voltage, and a source coupled to the second power supply voltage terminal.

* * * * *